(12) United States Patent
Ranade et al.

(10) Patent No.: US 10,566,106 B2
(45) Date of Patent: Feb. 18, 2020

(54) CONJUGATED POLYMER COATINGS AND METHODS FOR ATMOSPHERIC PLASMA DEPOSITION THEREOF

(71) Applicant: The Boeing Company, Chicago, IL (US)

(72) Inventors: Alpana Ranade, Renton, WA (US); Tejank P. Shah, Parlin, NJ (US); Patrick J. Kinlen, Fenton, MO (US)

(73) Assignee: THE BOEING COMPANY, Chicago, IL (US)

( * ) Notice: Subject to any disclaimer, the term of this patent is extended or adjusted under 35 U.S.C. 154(b) by 743 days.

(21) Appl. No.: 14/462,176

(22) Filed: Aug. 18, 2014

(65) Prior Publication Data
US 2016/0049226 A1  Feb. 18, 2016

(51) Int. Cl.
| | | |
|---|---|---|
| H01B 1/12 | (2006.01) | |
| H01B 13/30 | (2006.01) | |
| B05D 5/12 | (2006.01) | |
| B05D 1/00 | (2006.01) | |
| B05D 3/00 | (2006.01) | |
| B05D 3/10 | (2006.01) | |
| B64G 1/22 | (2006.01) | |
| H01L 51/00 | (2006.01) | |

(52) U.S. Cl.
CPC ............ *H01B 1/127* (2013.01); *B05D 1/62* (2013.01); *B05D 3/002* (2013.01); *B05D 3/10* (2013.01); *B05D 5/12* (2013.01); *B64G 1/226* (2013.01); *H01B 1/12* (2013.01); *H01B 1/128* (2013.01); *H01B 13/30* (2013.01); *H01L 51/0037* (2013.01)

(58) Field of Classification Search
None
See application file for complete search history.

(56) References Cited

U.S. PATENT DOCUMENTS

| | | | |
|---|---|---|---|
| 6,072,027 A * | 6/2000 | Scortichini | .......... C08G 61/122 528/412 |
| 7,455,892 B2 | 11/2008 | Goodwin | |
| 2004/0022945 A1 | 2/2004 | Goodwin | |
| 2009/0148615 A1 | 6/2009 | Vangeneugden | |

OTHER PUBLICATIONS

Winther-Jensen, et al., "Vapor Phase Polymerization of Pyrrole and Thiophene Using Iron(III) Sulfonates as Oxidizing Agents", Macromolecules, 2004, 37, pp. 5930-5935.*
Winther-Jensen and West, "Vapor-Phase Polymerization of 3,4-Ethylenedioxythiophene: A Route to Highly Conducting Polymer Surface Layers", Macromolecules, 2004, 37, pp. 4538-4543.*
Dams et al., "Plasma Deposition of Thiophene Derivatives Under Atmospheric Pressure," Chemical Vapor Deposition, vol. 2, Issue 12, Dec. 2006, pp. 719-727.
Dams, Roel, "Plasma Deposition of Conjugated Polymers at Atmospheric Pressure," Jun. 2007, downloaded from <https://www.vito.be/Lists/ScientificOutput/Attachments/2426/56346763.PDF>, pp. 1-194.

* cited by examiner

*Primary Examiner* — Scott R. Walshon
*Assistant Examiner* — Elaine M Vazquez
(74) *Attorney, Agent, or Firm* — MH2 Technology Law Group LLP (57) ABSTRACT

A method providing conductive coatings is provided. A dopant layer with a plasma deposited conjugated polymer is provided. Conductive, conjugated polymer coatings are also provided.

22 Claims, 4 Drawing Sheets

CONJUGATED POLYMER COATINGS AND METHODS FOR ATMOSPHERIC PLASMA DEPOSITION THEREOF

TECHNICAL FIELD

The present disclosure is related to layered substrate coatings comprising plasma deposited conjugated polymers that conduct electricity. The substrate coatings comprise a layer of doping material between the plasma deposited conjugated polymer.

Some existing methods to deposit conductive polymer films include Oxidative Chemical Vapor Deposition (oCVD), initiated CVD, thermal evaporation, pulsed laser deposition, vapor phase polymerization (VPP), or various solution processing techniques such as spin or spray coating. Solution processing requires the use of a large amount of chemical solvents, which is environmentally undesirable. Processes such as oCVD and VPP require the delivery of monomers into a vacuum chamber, where further chemical reactions can take place. Vacuum chambers require a large initial capital investment and also limit the size of parts that can be processed, so their use is limited for large components.

Conjugated polymer coatings can be formed by chemical or electrochemical techniques or a plasma deposition process. Polymerization in a vacuum plasma is expensive and is a batch process. Atmospheric plasma polymerizations can be done in a continuous manner with lower capital cost equipment.

In some cases, conjugated polymers are doped to provide conductivity. Doping of a conjugated polymer coating typically is performed after the actual conjugated polymer deposition step, which is a drawback because it is difficult to obtain a homogeneous distribution of the dopant throughout the deposition thickness, resulting in non-homogeneity of the dopant concentration. Recently, methods have been described where deposition of conjugated polymer coatings via atmospheric or intermediate pressure plasma polymerization includes the simultaneous introduction of a dopant. This technique also has drawbacks in controlling the homogeneity of the resultant film, the efficiency of dopant incorporation into the resultant film, and the resultant conductivity of such films.

SUMMARY

The present disclosure is related to a method, coating and articles having such coatings, as described in the appended claims.

In a first embodiment a method is provided. The method comprising the steps of (i) contacting an article surface with a solution of dopant in a volatile solvent, removing the volatile solvent and forming a dopant layer on the article surface; (ii) introducing one or more conjugated polymer precursors to an atmospheric plasma; (iii) depositing a conjugated polymer on at least a portion of the dopant layer and at least a portion of the article surface; and (iv) forming a conductive coating on the article surface. In an aspect of the first embodiment, the of steps (i), (ii), and (iii) are carried out in the sequence (i), (ii), and (iii). In another aspect of the first embodiment, alone or in combination with any other aspect of the first embodiment, each of steps (i), (ii), and (iii) are repeated in the sequence (i), (ii), and (iii) at least once.

In another aspect of the first embodiment, alone or in combination with any other aspect of the first embodiment, the volatile solvent comprises a $C_{1-8}$ alcohol, water, or mixture thereof.

In another aspect of the first embodiment, alone or in combination with any other aspect of the first embodiment, the dopant layer comprises an acceptor donor. In yet another aspect of the first embodiment, alone or in combination with any other aspect of the first embodiment, the acceptor donor is a metal salt. In yet another aspect of the first embodiment, alone or in combination with any other aspect of the first embodiment, the acceptor donor is a metal-halogen salt. In yet another aspect of the first embodiment, alone or in combination with any other aspect of the first embodiment, the metal is a transition metal salt, lanthanide metal salt, actinide metal salt, or combination thereof. In yet another aspect of the first embodiment, alone or in combination with any other aspect of the first embodiment, the metal is a transition metal-halogen salt, lanthanide metal-halogen salt, actinide metal-halogen salt, or combination thereof.

In another aspect of the first embodiment, alone or in combination with any other aspect of the first embodiment, the dopant layer comprises iron(III) tosylate, iron(iii) dodecylbenzenesulfonate, iron(iii) 4-morpholinepropanesulfonate, iron(iii) 4-pyridineethanesulfonate, iron(iii) 3-pyridinesulfonate iron(iii) alkylbenzenesulfonates, iron(iii) tetradecylsulfonate, iron(iii) 4-ethylbenzenesulfonate, iron (iii) camphor-sulfonate, iron(iii) R-10-camphorsulfonate, ammonium peroxydisulfate, ammonium persulfate, $HAuCl_4$, copper(II) chloride, $FeCl_3$, $FeBr_3$, FeOCl, $TiCl_4$, $ZrCl_4$, $HfCl_4$, $NbF_5$, $NbCl_5$, $TaCl_5$, $MoCl_5$, $WF_5$, $WCl_5$, $UF_6$, or $LnCl_3$.

In another aspect of the first embodiment, alone or in combination with any other aspect of the first embodiment, the one or more conjugated polymer precursors is one or more of an aromatic heterocycle or substituted benzenes; rubicene; pyrene; phenanthrene; perylene; pentacene; triphenylene and substituted derivatives; coronene; chrysene; benzopyrene; benzoperylene; benzanthracene; anthracene and derivatives thereof; pyrrole and substituted derivatives; thiophene and substituted derivatives, selenophene and substituted derivatives; aniline and substituted derivatives; furan and substituted derivatives; N-methylpyrrole and substituted derivatives; or isothionaphtene and substituted derivatives.

In another aspect of the first embodiment, alone or in combination with any other aspect of the first embodiment, the one or more conjugated polymer precursors is one or more of 3,4-ethylenedioxythiophene; thiophene-3-carboxylic acid; thiophene-3-carbaldehyde; tetrabromothiophene; pyrrole-3-carboxylic acid; 4-(1H-pyrrol-1-yl)aniline; 3-thiophenecarbonyl chloride; 3-thienylmethanol; 3-methylthiophene; 3-chlorothiophene; 3-butylthiophene; 3-bromothiophene; 3-bromo-4-methylthiophene; 3-bromo-2-chlorothiophene; 3-acetylthiophene; 3,4-dibromothiophene; 3-(1H-pyrrol-1-yl)aniline; 2-iodothiophene; 2-chlorothiophene; 2-chloro-3-methylthiophene; 2-bromothiophene; 2-bromo-5-chlorothiophene; 2-bromo-3-methylthiophene; 2,5-diidothiophene; 2,5-dibromothiophene; 2,4-dibromothiophene; 2,3-dibromothiophene; or 2-(3-thienyl)ethanol; 1-(2-aminophenyl)-pyrrole.

In another aspect of the first embodiment, alone or in combination with any other aspect of the first embodiment, the method further comprises, prior to step (i), rinsing the article surface with a $C_{1-6}$ alcohol. In yet another aspect of the first embodiment, alone or in combination with any other aspect of the first embodiment, the method further comprises, prior to step (i), plasma cleaning the article surface. In yet another aspect of the first embodiment, alone or in combination with any other aspect of the first embodiment, the method further comprises, prior to step (i), rinsing the article surface with a $C_{1-8}$ alcohol and subsequently plasma cleaning the article surface.

In another aspect of the first embodiment, alone or in combination with any other aspect of the first embodiment, the conjugated polymer has a conductive coating sheet resistance in the range of 5-1000 ohms/sq. In another aspect of the first embodiment, alone or in combination with any other aspect of the first embodiment, the conjugated polymer has a conductive coating sheet resistance in the range of 1000-10,000,000 ohms/sq.

In another aspect of the first embodiment, alone or in combination with any other aspect of the first embodiment, the method further comprises, in step (ii) the introduction to the plasma of one or more additional precursors selected from tetrafluoroethylene; glycidyl methacrylate; dimethylaminomethylstyrene; perfluoroalkyl ethyl methacrylate; trivinyltrimethoxycycletrisiloxane; furfuryl methacrylate; cyclohexyl methacryate-co-ethylene glycol dimethacrylate; pentafluorophenyl methacrylate-co-ethylene glycol diacrylate; 2-hydroxyethyl methacrylate-co-ethylene glycol diacrylate; and methacrylic acid-co-ethylene glycol dimethacrylate.

In a second embodiment a conductive, charge-dissipating coating is provided. The coating comprising a solvent deposited dopant layer; and a conductive layer atmospherically plasma-deposited at least partially on the dopant layer, the conductive layer comprising plasma polymerized conductive polymer precursor material. In an aspect of the second embodiment, the dopant layer and the conductive layer are arranged in a repeating, vertically stacked arrangement.

In another aspect of the second embodiment, alone or in combination with any other aspect of the second embodiment, the dopant layer comprises a metal salt. In yet another aspect of the second embodiment, alone or in combination with any other aspect of the second embodiment, the dopant layer comprises a metal-halogen salt. In yet another aspect of the second embodiment, alone or in combination with any other aspect of the second embodiment, the metal is a transition metal salt, lanthanide metal salt, actinide metal salt, or combination thereof. In yet another aspect of the second embodiment, alone or in combination with any other aspect of the second embodiment, the metal is a transition metal-halogen salt, lanthanide metal-halogen salt, actinide metal-halogen salt, or combination thereof.

In another aspect of the second embodiment, alone or in combination with any other aspect of the second embodiment, the dopant layer comprises one or more of iron(III) tosylate, iron(iii) dodecylbenzenesulfonate, iron(iii) 4-morpholinepropanesulfonate, iron(iii) 4-pyridineethanesulfonate, iron(iii) 3-pyridinesulfonate iron(iii) alkylbenzenesulfonates, iron(iii) tetradecylsulfonate, iron(iii) 4-ethylbenzenesulfonate, iron(iii) camphor-sulfonate, iron (iii) R-10-camphorsulfonate, ammonium peroxydisulfate, ammonium persulfate, $HAuCl_4$, copper(II) chloride, $FeCl_3$, $FeBr_3$, FeOCl, $TiCl_4$, $ZrCl_4$, $HfCl_4$, $NbF_5$, $NbCl_5$, $TaCl_5$, $MoCl_5$, $WF_5$, $WCl_5$, $UF_6$, or $LnCl_3$.

In another aspect of the second embodiment, alone or in combination with any other aspect of the second embodiment, the conductive layer comprises one or more plasma polymerized conductive polymer precursor materials selected from 3,4-ethylenedioxythiophene; thiophene-3-carboxylic acid; thiophene-3-carbaldehyde; tetrabromothiophene; pyrrole-3-carboxylic acid; 4-(1H-pyrrol-1-yl)aniline; 3-thiophenecarbonyl chloride; 3-thienylmethanol; 3-methylthiophene; 3-chlorothiophene; 3-butylthiophene; 3-bromothiophene; 3-bromo-4-methylthiophene; 3-bromo-2-chlorothiophene; 3-acetylthiophene; 3,4-dibromothiophene; 3-(1H-pyrrol-1-yl)aniline; 2-iodothiophene; 2-chlorothiophene; 2-chloro-3-methylthiophene; 2-bromothiophene; 2-bromo-5-chlorothiophene; 2-bromo-3-methylthiophene; 2,5-diidothiophene; 2,5-dibromothiophene; 2,4-dibromothiophene; 2,3-dibromothiophene; 2-(3-thienyl)ethanol; or 1-(2-aminophenyl)-pyrrole.

In another aspect of the second embodiment, alone or in combination with any other aspect of the second embodiment, the conductive layer comprises one or more plasma polymerized conductive polymer precursor materials selected from one or more of an aromatic heterocycle or substituted benzene; rubicene; pyrene; phenanthrene; perylene; pentacene; triphenylene and substituted derivatives; coronene; chrysene; benzopyrene; benzoperylene; benzanthracene; anthracene and derivatives thereof; pyrrole and substituted derivatives; thiophene and substituted derivatives, selenophene and substituted derivatives; aniline and substituted derivatives; furan and substituted derivatives; N-methylpyrrole and substituted derivatives; or isothionaphtene and substituted derivatives.

In another aspect of the second embodiment, alone or in combination with any other aspect of the second embodiment, the conductive layer further comprises additional plasma-polymerized monomers selected from one or more of tetrafluoroethylene; glycidyl methacrylate; dimethylaminomethylstyrene; perfluoroalkyl ethyl methacrylate; trivinyltrimethoxycycletrisiloxane; furfuryl methacrylate; cyclohexyl methacryate-co-ethylene glycol dimethacrylate; pentafluorophenyl methacrylate-co-ethylene glycol diacrylate; 2-hydroxyethyl methacrylate-co-ethylene glycol diacrylate; or methacrylic acid-co-ethylene glycol dimethacrylate.

In another aspect of the second embodiment, alone or in combination with any other aspect of the second embodiment, the conjugated polymer has a conductive coating sheet resistance in the range of 5-1000 ohms/sq. In another aspect of the second embodiment, alone or in combination with any other aspect of the second embodiment, the conjugated polymer has a conductive coating sheet resistance in the range of 1000-10,000,000 ohms/sq.

In another embodiment, an article is prepared by the method of any one or more aspects of the first embodiment. In yet another embodiment, an article coated with the conductive coating as defined in any one or more aspects of the second embodiment. In yet another embodiment, the article comprises at least a portion of an aerospace vehicle.

DETAILED DESCRIPTION

This disclosure allows for the deposition of conductive polymeric films, e.g., thin films, and coatings (hereafter collectively referred to as "coatings") through the use of atmospheric pressure plasma equipment and techniques, without the use of any sort of chamber, e.g., vacuum chamber. These coatings and articles having such coatings may be created in open air environments, for example, using a suitable plasma head mounted to a multi-axis robot, allowing for the coating of parts of different shapes and sizes and surface irregularity. The deposition parameters and one or more chemical precursors can be chosen and/or modified in-situ in order to create coatings with different properties, e.g., ranges of conductivity. The disclosure allows such coatings to be applied in localized areas (or in predetermined patterns) where enhanced conductivity is desired or conductive paths or traces are desired.

Conductive polymer compositions based on polyanilines and poly(3,4-alkylenedioxythiophenes now have electrical conductivities reaching into the thousands of Ω/cm capability. It is understood that the proper combination of chemical composition of the polymer and processing to ordered and oriented structures can produce materials with especially high conductivity and stability approaching metallic behavior. These materials are of high interest in materials science because they are lightweight, flexible, and can be synthesized at relatively low cost. Therefore, they are ideal materials for applications such as antistatic layers, field effect transistors, or corrosion protection coatings. Conjugated polymers are typically synthesized in a batch process via chemical or electrochemical methods, and processing can be difficult due to the rigid backbone. The use of atmospheric plasma deposition to make these structures would allow for the deposition of conductive polymer coatings through an in-line manufacturing process, which can significantly reduce costs and increase the number of applications for this process. In addition, the present methods and coatings can create localized patches of conductive materials without the use of masking on components. Finally, the properties of the coatings herein disclosed, such as conductivity and transparency, can be controlled either in-bulk or in specific regions of the coating by changing deposition conditions during processing.

The proposed disclosure provides conductive polymer coatings made in open air without the use of a vacuum/inert gas chamber. In addition, resultant coating characteristics can be controlled both in-bulk and locally by using automation to scan a plasma head over an area while optionally changing the deposition parameters. Advantageously, localized patches of material can be applied on specific areas, without the use of masking. The disclosed method provides durable and conductive coatings useful for a variety of commercial and military transportation programs, such as aerospace vehicles. The present methods also provide for the introduction of other materials/precursors into the coating in a cost-effective manner in order to create coatings comprising multifunctional thin film stacks.

In one aspect, a method for forming a conjugated polymer coating on a substrate by plasma deposition is provided, where a substrate is introduced to a dopant in a volatile solvent so as to provide a dopant layer. The volatile solvent can be an alcohol or other organic solvent or a mixture of organic solvent and water. In one aspect, the solvent is a $C_{1-8}$ alcohol. In one aspect the solvent is methanol, ethanol, propanol, isopropanol, butyl alcohol, t-butyl alcohol, sec-butyl alcohol or mixtures thereof.

The dopant of the dopant layer can be a "donor or acceptor dopant" as those terms are used in the art. In one aspect the doping layer results in a stable doping with high conductivities of the subsequently formed conjugated polymer coating. Examples of the acceptor type dopant are metal salts. Metal salts include alkali metal salts, alkali earth metal salts, transition metal salts, lanthanide metal salts and actinide metal salts. These metal salts can be halogen salts, such as fluoride, chloride, bromide, or iodine salts.

Other examples of acceptor type dopants include halogens such as $Cl_2$, $Br_2$, $I_2$, ICl, $ICl_3$, IBr and IF; Lewis acids such as $PF_5$, $AsF_5$, $SbF_5$, $BF_3$, $BCl_3$, $BBr_3$ and $SO_3$; protonic acids such as HF, HCl, $HNO_3$, $H_2SO_4$, $HClO_4$, $FSO_3H$, $ClSO_3H$ and $CF_3SO_3H$; organic acids such as acetic acid, formic acid and amino acid. Examples of, transition metal compounds as dopants include $FeCl_3$, FeOCl, $TiCl_4$, $ZrCl_4$, $HfCl_4$, $NbF_5$, $NbCl_5$, $TaCl_5$, $MoCl_5$, $WF_5$, $WCl_5$, $UF_6$, $LnCl_3$ and anions such as $Cl^-$, $Br^-$, $I^-$, $ClO^{4-}$, $PF^{6-}$, $AsF^{5-}$, $SbF^{6-}$, $BF^{4-}$ and sulfonate anions. Examples of donor dopants are alkaline metals such as Li, Na, K, Rb and Cs; alkaline earth metals such as Ca, Sr and Ba; rare earth metals such as Y, La, Ce, Pr, Nd, Sm, Eu, Gd, Tb, Dy, Ho, Er and Yb; an ammonium ion; $R_4P^+$, $R_4As^+$ and $R_3S^+$.

In one aspect, the dopant layer comprises one or more of $FeCl_3$, iron(III) tosylate, iron(iii) dodecylbenzenesulfonate, iron(iii) 4-morpholinepropanesulfonate, iron(iii) 4-pyridineethanesulfonate, iron(iii) 3-pyridinesulfonate iron(iii) alkylbenzenesulfonates, iron(iii) tetradecylsulfonate, iron (iii) 4-ethylbenzenesulfonate, iron(iii) camphor-sulfonate, iron(iii) R-10-camphorsulfonate, ammonium peroxydisulfate, ammonium persulfate, $HAuCl_4$, copper(II) chloride.

After introduction to the substrate of the dopant in a volatile solvent, the solvent can be completely removed, partially removed, or the solvent can be allowed to be removed over a predetermined time interval and/or pressure or vacuum. Heating, either direct or indirect can be used alone or in combination with vacuum or moving gas.

Prior to the introduction of the dopant layer to the substrate, the substrate can be pre-treated, e.g., by plasma cleaning and/or solvent cleaning. Prior to the introduction or forming of the conjugated polymer coating, the dopant layer can be exposed to the plasma without the conjugated polymer precursor component for a time sufficient to remove residual solvent, prepare the dopant layer for receiving the conjugated polymer, and/or modify the chemistry of the dopant layer by the introduction of plasma reactive species into the dopant layer. The above steps can be carried out in sequence or can be staged with long or short time intervals between each step.

In another aspect, combination with the solvent deposited dopant layer, in situ doping can be done by injecting the dopant simultaneously with the conjugated polymer precursor into the plasma or its after-glow region. A liquid suspension or dissolved dopant may be added as described elsewhere herein for introduction of the conjugated polymer precursor, for example, as an aerosol, or injected or carried via a carrier gas, into the plasma or after-glow region. In aspects of the present disclosure, the after-glow region extends about 1 centimeter from the plasma, depending on the equipment used.

In one aspect, a method for forming a conjugated polymer coating on a substrate by plasma deposition is provided. This method is characterized by the introduction of material into the plasma discharge at atmospheric or intermediate (1 mbar to 1 bar) pressure. According to the present method, a substrate having a solvent deposited dopant layer is placed in or led through a plasma discharge head or placed or led through the gas stream of a plasma discharge head. In one aspect, a conjugated polymer precursor (e.g., monomer or chemical composition or chemical compound) or a plurality of different precursors is introduced to in the plasma or the gas stream coming from the plasma discharge. Introduction of the conjugated polymer precursor can be by aerosol, carrier gas bubbling, direct injection, etc. Examples of aerosol generators are ultrasonic nebulizers, bubblers or electrospraying techniques. Electrostatic spraying techniques allow to charge or discharge the precursor before entering the plasma. The one or more precursor can also be injected as a gas or a vapor. Other materials can be included along with the conjugated polymer precursor. The mixing of the conjugated polymer precursor and the additional material may take place before or during the introduction of the materials into the plasma. The additional material can be introduced during the conjugated polymer precursor plasma deposition, but not necessarily during the whole duration of said deposition, e.g., added during one or more periods during the duration of the plasma deposition. The deposition process can be repeated to provide stacks of dopant layer and conjugated polymer, or a single dopant layer and multiple conjugated polymer layers.

An example of an atmospheric pressure plasma reactor is an RF or microwave glow discharge, a pulsed discharge or a plasma jet. Yet another atmospheric pressure plasma reactor is the dielectric barrier discharge, typically characterized by at least one set of spatially separated electrodes with an electrode gap between 0.01 mm and 100 mm. In one aspect, the present method excludes the dielectric barrier discharge reactor as it is generally unsuitable for adaptation to robotic automation.

A typical precursor for forming a conjugated polymer coating can be an organic monomer, such as an aromatic heterocycle or substituted benzene. Examples of aromatic heterocyclic precursors include, but are not limited to thiophene, pyrrole and furan. Also derivatives of former heterocycles are interesting precursors. Examples include, but are not limited to 3,4-ethylenedioxythiophene (EDOT), isothionaphtene, 2,5-dibromothiophene, 2,5-diiodothiophene, 2-bromo-5-chlorothiophene, 3-bromo-2-chlorothiophene, 2-bromo-3-methylthiophene, 3-bromo-4-methylthiophene, 2-bromothiophene, 3-bromothiophene, 3-butylthiophene, 2-chlorothiophene, 3-chlorothiophene, 3-methylthiophene, tetrabromothiophene, 2-iodothiophene, thiophene-3-carbaldehyde, 3-acetylthiophene, 2-(3-thienyl)ethanol, thiophene-3-carboxylic acid, 2,3-dibromothiophene, 2,4-dibromothiophene, 3,4-dibromothiophene, 2-chloro-3-methylthiophene, 3-thiophenecarbonyl chloride, 3-thienylmethanol, N-methylpyrrole, 1-(2-aminophenyl)-pyrrole, pyrrole-3-carboxylic acid, 3-(1H-pyrrol-1-yl)aniline, and 4-(1H-pyrrol-1-yl)aniline.

Conjugated polymer precursors can also be selected from polycyclic aromatic compounds. Examples of polycyclic aromatic compounds include, but are not limited to naphthalene, anthracene, triphenylene, chrysene, coronene, pentacene benzanthracene, perylene, benzoperylene, phenanthrene, pyrene, benzopyrene, rubicene and derivatives thereof. Acetylene can be used alone or in combination with one or more of the other listed conjugated polymer precursors. Graphene-precursor materials can also be used alone or in combination with one or more of the other listed conjugated polymer precursors.

In combination with the one or more of the other listed conjugated polymer precursors, one or more of organic monomers, inorganic monomers, hybrid inorganic-organic monomers, inorganic and/or organic and/or hybrid inorganic-organic oligomers or low molecular weight polymers (hereafter referred to collectively or individually as "additional monomer") may be injected separately or concurrently into the plasma, before, during or after the one or more of the other listed conjugated polymer precursors. These oligomers and polymers are chemically or electrochemically polymerized in the plasma and/or chemically combined and/or deposited isolated from the polymerized product of the one or more above mentioned conjugated polymer precursors.

The additional monomer can include but are not limited to, hexamethyldisiloxane, diethoxydiethylsilane, glycidoxypropyl trimethoxysilane, tetraethoxysilane, triethoxyvinylsilane, hexamethyltrisiloxane, octamethylcyclotetrasiloxane, tetra methylcyclotetrasiloxane, hexamethyldisilane, hexamethyldisilazane, methyltriethoxysilane, methyltrimethoxysilane, tetraethylorthosilcate, 3-mercaptopropyltriethoxysilane, vinyltris(2-methoxyethoxy)-silane, allyltriethoxysilane, (3-glycidoxypropyl)-trimethoxysilane, acrylates, and co-polymers thereof.

The additional monomer is useful to modify the properties of the conductive conjugated polymer coating. Such modification can include one or more of improved substrate adhesion, higher crosslinking density which improves mechanical properties of the conjugated plasma coating, conductivity (higher or lower), wear resistance, corrosion resistance, water/liquid repellency, ozone/UV resistance, texture, paintability, etc. Homogeneous or non-homogenous coatings can be prepared by adjusting the feed rate, concentration, number of passes of the plasma head over a substrate, and duration of treatment, among other parameter modulations.

The properties of the conductive conjugated polymer coatings can be optimized by a multi-step or repetitive plasma deposition processes. A barrier coating may be deposited onto the final surface of the conductive conjugated coating to protect it from environmental influences. The barrier coatings can be formed in the same plasma head device by changing the injected gas mixture or aerosol after a certain period of time or can be applied using non-plasma methods. The substrate can be moved by, for example, via a roll-to-roll system take-up system from one plasma unit to the next or to non-plasma equipment where consecutive depositions are performed.

The present disclosure also provides a method of producing the present coatings on a large, stationary substrate. In this case a coating can be formed using robotics coupled to controlled automation equipment. The robotics can be programmed to do a single or a sequence of repeat passes over all or a part of the article surface (or substrate) by manipulation of the spatial relationship of the atmospheric plasma glow discharge head to that of the substrate. In this manner, curved, flat, or otherwise irregular surfaces can be coated. The article surface topography can be mapped and used by the robotics/automation to facilitate the translation about the substrate, as are known in the art. The large substrate can be subjected to one or more passes under the glow discharge. Remote or integrated measuring devices can be included in the robotics, for example, in proximity to the plasma head to measure coating thickness and/or coating chemical composition and/or conductivity, for example, using FT-IR, UV, capacitance, etc. Such measuring devices can be coupled to the automation or robotics controller for quality control, as are known in the art.

Alternatively, the substrate may be coated on a continuous basis by transportation through an atmospheric plasma glow discharge, for example, manually, or by way of a reel to reel mechanism in which the substrate travels from a first reel, under the plasma head and is taken up onto a second reel at a constant or otherwise programmed speed and/or velocity. The substrate can be subjected to one or more passes under the plasma head. Alternatively the substrate may be passed through a series of atmospheric glow discharge plasma heads.

Figure 1:
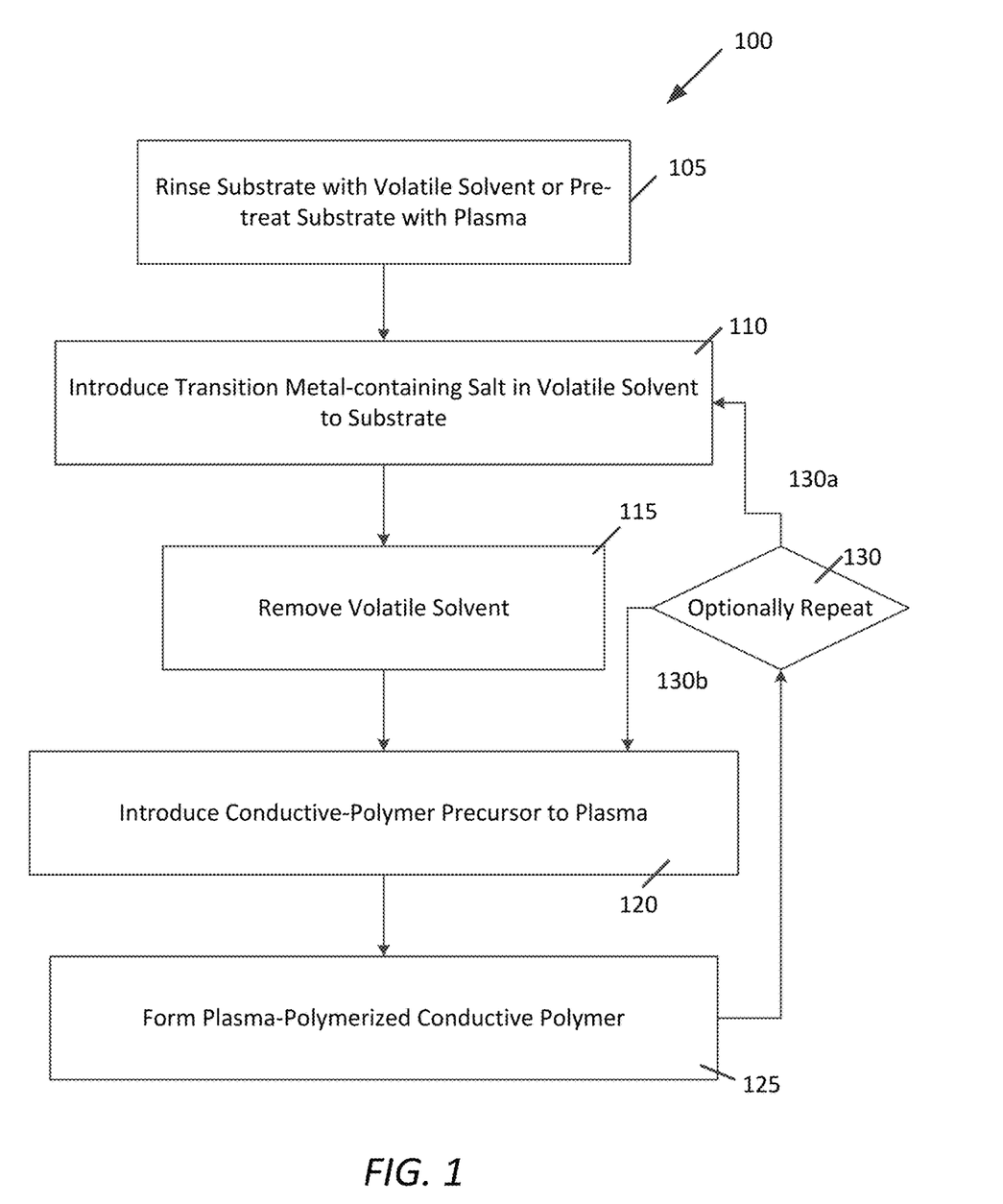
FIG. 1 illustrates a process flow diagram to form a conductive, plasma-deposited conjugate polymer-containing coating according to an embodiment of the disclosure.

The present disclosure will now be illustrated in detail with reference to the accompanying drawings. As shown in FIG. 1, process flowchart diagram 100 is depicted having an optional rinse/clean substrate step 105 that would include drying of the substrate. In the flow chart the term "substrate" is used interchangeably with "article", the article can be any 3-D shape. Step 110 comprises introduction of dopant solution to the substrate so as to for the dopant layer, followed by drying Step 115. Step 120 includes setting plasma conditions, initiating plasma, and the introduction of conjugated polymer precursor to the plasma. Step 125 provides for preparation of the conductive, conjugated polymer layer. Optional Step 130 provides for the Step 130a of repeating the application of the dopant layer and/or Step 130b of repeating the conjugated polymer layer. During the process depicted in Steps 120, 125 and 130, changing of one or more process parameters, introducing the same or different chemical precursor or precursors, with the option of changing one or more process parameters during and/or after deposition of layers. By way of example, "process parameters" include one or more of plasma-related parameters or process controls such as plasma power or oxygen flow rate, the position and/or distance 28 of the plasma head relative to the substrate, the velocity and/or acceleration of the plasma head during deposition, the flow rate of the one or more chemical precursor materials, and the like. The process can be configured for continuous operation of the method and/or auto- or manual termination.

Figure 2A:
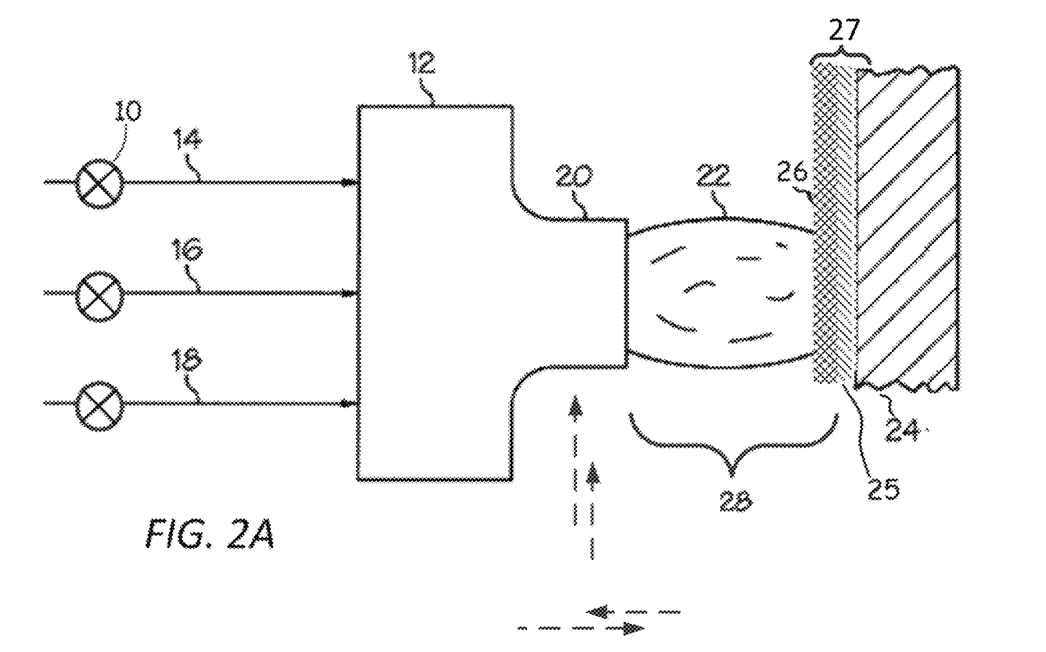
FIGS. 2A and 2B represents a plasma head embodiment for performing the method of the disclosure and a method of forming a conductive, plasma-deposited conjugate polymer-containing coating according to an embodiment of the disclosure.
Figure 2B:
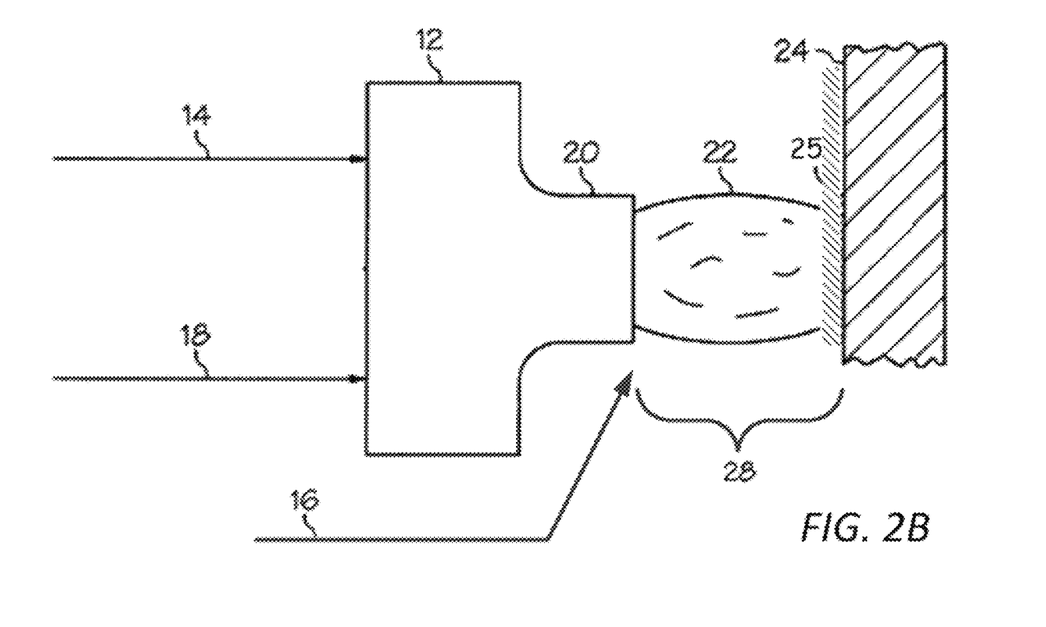

Referring now to FIG. 2A and FIG. 2B, one aspect of the disclosed system for depositing a conductive coating is depicted, that includes an atmospheric plasma device 12, one or more plasma-source gas streams 14, one or more precursor streams 16 and, optionally, one or more shielding gas streams 18. The output 20 of the atmospheric plasma device 12 is a mono- or multicomponent plasma 22, which can be horizontally or vertically positioned relative to the dopant layer 25 previously introduced to substrate 24. The "substrate" is used interchangeably with "article," the article can be any 3-D shape. Plasma 22 can be of any shape, for example, as shown in FIG. 2A, or as a point source, shower-head like pattern, or a divergent or convergent shape. FIG. 2B depicts an alternate arrangement of streams, e.g., stream 16 being external and/or directed to the afterglow region of the plasma.

The atmospheric plasma device 12 can be any apparatus or system capable of exciting matter to form plasma 22, preferably under atmospheric conditions. The atmospheric plasma device 12 can be configured to generate the plasma 22 using direct current energy, radio frequency energy or the like, as is known in the art. In one aspect, the atmospheric plasma device 12 can be an atmospheric plasma spray gun. One example of an atmospheric plasma device 12 useful in accordance with the present disclosure is the ATOMFLO™ 400 plasma system available from Surfx Technologies, LLC of Culver City, Calif. The presently disclosed system can be configured by supplying the atmospheric plasma device 12 with the plasma-source gas, conjugated polymer precursor and shielding gas streams 14, 16, 18 to form the plasma 22. The size (width or diameter) of the plasma 22 may depend on various factors, including the size of the atmospheric plasma device 12 and the flow rates of the plasma-source gas, conjugated polymer precursor and shielding gas streams 14, 16, 18. For example, the plasma 22 can be about 2 inches wide, 6 inches wide, 1-2 feet wide, or larger.

The conjugated polymer precursor stream 16 can be one or more streams of the same or different precursor or precursors and, optionally, a carrier gas for introducing the conjugated polymer precursor to the atmospheric plasma device 12. The carrier gas can be selected as a gas or combination of gases that does not undergo substantial plasma formation in the atmospheric plasma device 12. Examples of useful carrier gases include the noble gases, e.g., helium gas (He) and argon gas (Ar).

The plasma-source gas stream 14 can be a stream of one or more gaseous chemical precursors (reactive and/or non-reactive) capable of forming atmospheric plasma upon activation by the atmospheric plasma device 12. Examples of appropriate plasma-forming gases include molecular compounds naturally occurring as a gas, such as oxygen gas ($O_2$), nitrogen gas ($N_2$), hydrogen gas ($H_2$) and fluorine gas ($F_2$), as well as other gases such as the noble gases (helium, neon, argon, krypton). The plasma-source gas stream 14 can also include specific combinations of gases. By way of example, the plasma-source gas stream 14 can be a stream of substantially pure helium or argon gas that may allow the plasma to have a high concentration of active species while still maintaining a low temperature so as to deposit on temperature-sensitive polymers. The helium or argon gas may further contain one or more additional gases such as oxygen, nitrogen, carbon dioxide, hydrogen sulfide, ammonium, etc. The plasma-source gas stream 14 can be programmed for feeding the plasma device 12 for a time suitable to facilitate introduction of specific source gas streams combinations.

In one aspect, the plasma-source gas stream 14 can be supplied to the atmospheric plasma device 12 at non-ambient conditions. In another aspect, the plasma-source gas stream 14 can be supplied to the atmospheric plasma device 12 at ambient conditions. For example, the plasma-source gas stream 14 can be at a flow rate of about 30 LPM and a temperature of about 25° C. Those skilled in the art will appreciate that physical conditions of the plasma-source gas stream 14 can vary depend upon the specific application and can be adjusted to optimize the performance of the atmospheric plasma device 12 depending on the nature of the conjugated polymer precursor, the substrate, and/or the final thickness and/or final composition of the coating desired.

The substrate 24 can be any substrate capable of receiving the dopant layer 25 and conductive, conjugated polymer coating 26 by way of plasma 22. Substrate 24 can be metal or non-metal, where non-metal is inclusive of ceramics, plastics, polymers, composites of inorganic/organic materials, composites of polymers and inorganic/organic fibers. Substrate 24 can itself be conductive, nonconductive, or semi-conductive. In one particular aspect, the substrate 24 can be a transparent polymeric substrate, such as stretched acrylic, commonly used in windshields and windows of aircraft. Furthermore, while FIG. 2A shows a substrate 24 having a substantially flat configuration, those skilled in the art will appreciate that with plasma device 12 and robotics, substrate 24 can have various shapes, surface contour, sizes and configurations without departing from the scope of the present disclosure. In one aspect, all or part of the substrate is that of a satellite, an aerospace vehicle, or other form of transportation. Again with reference to FIGS. 2A and 2B, the plasma device 12 can be translated horizontally and/or vertically relative to the substrate surface as indicated by the pair of dashed double arrows.

In one aspect, the conjugated polymer precursor can be a relatively high vapor pressure liquid at standard temperature and pressure, and the carrier gas can be bubbled through the precursor (if liquid) or a solution of the precursor to form the precursor stream 16. However, those skilled in the art will appreciate that various alternative techniques, such as vaporization, can be used to introduce one or more precursors to the precursor stream 16. In one exemplary aspect, the precursor stream 16 can be formed by bubbling helium gas through EDOT liquid at ambient conditions.

The shielding gas stream 18 can be a stream of shielding gas that does not undergo substantial plasma formation in the atmospheric plasma device 12. The shielding gas can be present in the plasma 22, but, without being limited to any particular theory, may minimize the effects of atmospheric water, oxygen and other contaminants on the plasma 22. Examples of appropriate shielding gases include the noble gases, e.g., helium gas (He) and argon gas (Ar). The shielding gas stream 18 may include combinations of shielding gases. In one particular aspect, the shielding gas stream 18 can be a stream of substantially pure helium gas. The shielding gas can be used to bubble through a solution of or the liquid precursor.

In one aspect, the shielding gas stream 18 can be supplied to the atmospheric plasma device 12 at non-ambient conditions. In another aspect, the shielding gas stream 14 can be supplied to the atmospheric plasma device 12 at ambient conditions. For example, the shielding gas stream 14 can be at a flow rate of about 30 LPM and a temperature of about 25° C. Those skilled in the art will appreciate that physical conditions of the shielding gas stream 14 may depend upon the specific application and can be adjusted to optimize the performance of the atmospheric plasma device 12.

At this point, those skilled in the art will appreciate that the plasma-source gas stream 14, the conjugated polymer precursor stream 16 and the shielding gas stream 18 can be configured for introduction to the atmospheric plasma device 12 to form the plasma 22. However, those skilled in the art will also appreciate that two or more of the plasma-source gas, one or more conjugated polymer precursors, and shielding gas streams 14, 16, 18 can be combined and/or mixed prior to reaching the atmospheric plasma device 12. For example, the plasma-source gas, conjugated polymer precursor, and shielding gas streams 14, 16, 18 can be supplied to the atmospheric plasma device 12 as a single stream.

The flow rates of the plasma-source gas, conjugated polymer precursor and shielding gas streams 14, 16, 18 can be controlled to obtain desired concentrations of the plasma-source gas, conjugated polymer precursor and shielding gas in the plasma 22. Shown in FIG. 2A, control valves 10 can be provided on the plasma-source gas, conjugated polymer precursor and shielding gas streams 14, 16, 18 to control the associated flow rates. Those skilled in the art will appreciate that the relative concentrations of the plasma-source gas, conjugated polymer precursor and shielding gas in the plasma 22 can be manipulated to optimize performance of the atmospheric plasma device 12 and to impart the resulting conductive coating 27 comprising dopant layer 25 and conjugated polymer layer 26 with desired electrical properties. For example, the concentration of oxygen in the plasma 22 can be decreased (e.g., by adjusting flow rate) to increase or decrease the conductance of the coating 26. Alternatively, the concentration of oxygen in the plasma 22 can be increased yielding a denser, e.g., harder layer (e.g., greater modulus). Likewise, the concentration of oxygen in the plasma 22 can be decreased to render the coating with a lower modulus and more elasticity.

In one aspect, the plasma-source gas stream 14 may comprise about 30 LPM of the input to the atmospheric plasma device 12 and the conjugated polymer precursor stream 16 may comprise about 1-5 LPM of the input to the atmospheric plasma device 12, optionally with the shielding gas stream 18 comprising the balance. In another aspect, the plasma-source gas stream 14 may comprise at most about 2 percent by volume of the input to the atmospheric plasma device 12 and the conjugated polymer precursor stream 16 may comprise at most about 5 percent by volume of the input to the atmospheric plasma device 12, with the shielding gas stream 18 comprising the balance. In yet another aspect, the plasma-source gas stream 14 may comprise about 1 to 2 percent by volume of the input to the atmospheric plasma device 12 and the conjugated polymer precursor stream 16 may comprise about 0 to about 10 percent by volume of the input to the atmospheric plasma device 12, with the shielding gas stream 18 comprising 0-100 percent by volume.

Referring again to FIGS. 2A, 2B, a method for applying a conductive conjugated polymer precursor coating 27 to a substrate 24, can begin with the step of cleaning the substrate, not shown. The substrate 24 can be cleaned using various solvents, such as ketones or light alcohols (e.g., methanol, ethanol, or isopropyl alcohol). An oxidative or non-oxidative plasma may also be used to clean and/or activate the substrate 24, such as oxygen or argon. The presence of oxygen in the plasma may activate the surface receiving the components of the conductive coating 27. The clean substrate may optionally be treated with an adhesion promoter, such as an aluminum-based sol-gel adhesion promoter or silicon-based adhesion promoter, as is known in the art.

While a hand-held device can be used, those skilled in the art will appreciate that appropriate automation can be employed such that a multi-axis controlled unit is provided and/or maintained between and/or along the substrate 24 and the atmospheric plasma device 12. Other coatings (non-plasma deposited) can be applied to the conductive coating 27 using any other appropriate coating methods.

Figure 3:
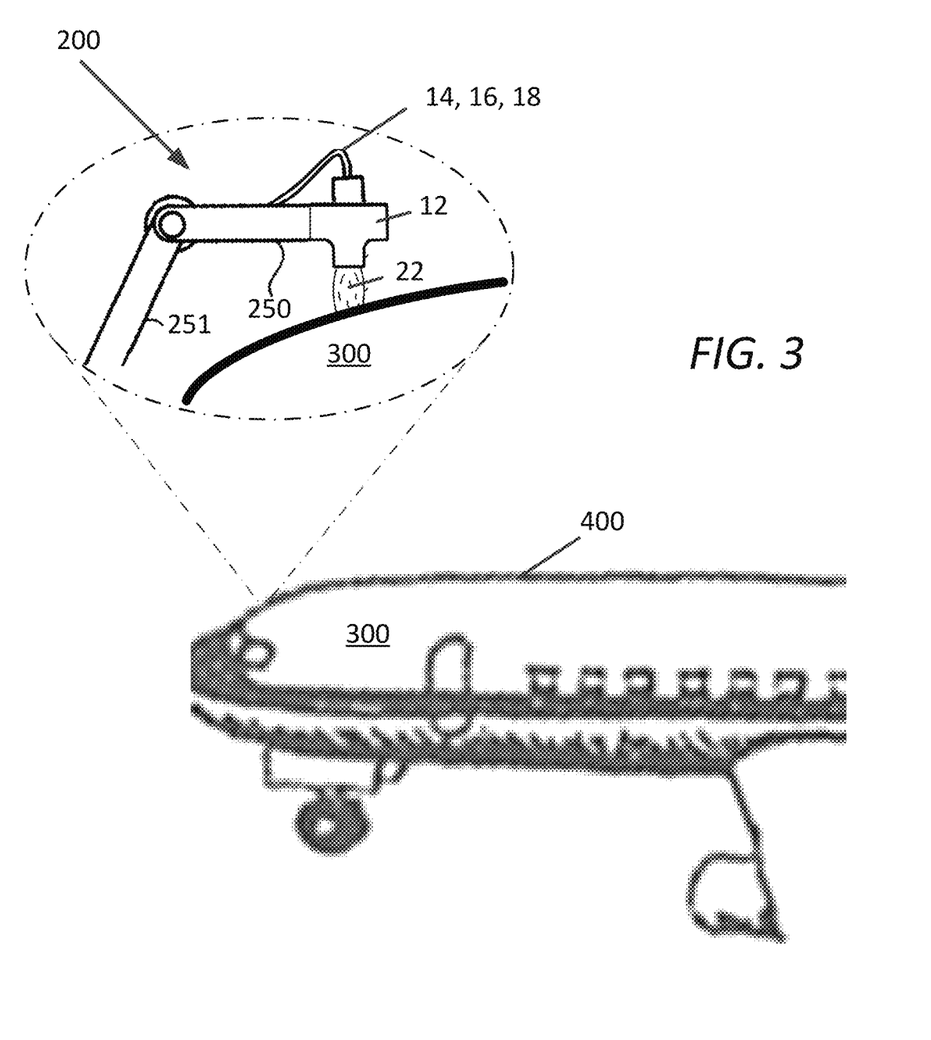
FIG. 3 illustrates a process for coating a 3-D article with the conductive, plasma-deposited conjugate polymer-containing coating, according to an embodiment of the disclosure.

With reference to FIG. 3, an application of the present method and conductive coating is shown. Thus, robotics unit 200 having reticulated arm components 250, 251 carrying plasma head 12 with feed lines 14, 16, and optionally 18, is configured to apply conjugated polymer coating on dopant layer deposited on surface 300 of aerospace vehicle 400.

EXAMPLES

Pyrrole and 3,4-ethylenedioxythiophene ("EDOT") canisters were ordered through Sigma Aldrich. $FeCl_3$.hexahydrate was used as an exemplary oxidant and dopant for the synthesized conductive conjugated polymer coating samples. $FeCl_3$.hexahydrate can be substituted with acceptor type dopants such as iron(III) tosylate, iron(iii) dodecylbenzenesulfonate, iron(iii) 4-morpholinepropanesulfonate, iron(iii) 4-pyridineethanesulfonate, iron(iii) 3-pyridinesulfonate iron(iii) alkylbenzenesulfonates, iron(iii) tetradecylsulfonate, iron(iii) 4-ethylbenzenesulfonate, iron(iii) camphor-sulfonate, iron(iii) R-10-camphorsulfonate, ammonium peroxydisulfate, ammonium persulfate, HAuCl4, copper(II) chloride $FeBr_3$, FeOCl, $TiCl_4$, $ZrCl_4$, $HfCl_4$, $NbF_5$, $NbCl_5$, $TaCl_5$, $MoCl_5$, $WF_5$, $WCl_5$, $UF_6$, $LnCl_3$ or used in combination with donor dopants from alkaline metals such as Li, Na, K, Rb and Cs; alkaline earth metals such as Ca, Sr and Ba; rare earth metals such as Y, La, Ce, Pr, Nd, Sm, Eu, Gd, Tb, Dy, Ho, Er and Yb; or ammonium ion, $R_4P^+$, $R_4As^+$ and $R_3S^+$ cations.

A typical experimental set-up consists of employing a 6-axis Kuka Robot arm that holds a plasma head with a showergas distributor. Plasma enhanced chemical vapor deposition of poly(pyrrole) ("PPy") coatings were deposited atop Fisherbrand® microscope cover glass for analysis. Plasma enhanced chemical vapor deposition of poly(3,4-ethylenedioxythiophene) ("PEDOT") was deposited atop stretched bare acrylic. A $2^{8-4}$ fractional factorial design of experiment (DOE) was developed and used to test the effect of 8 factors at 2 levels for the synthesis of PEDOT thin films as described in Table 1.

TABLE 1

EDOT 28-4 Fractional Factorial Design

|  | Levels | |
| --- | --- | --- |
|  | Low Value | High Value |
| Temperature (° C.) | 60 | 80 |
| Bubbler Flow Rate (LPM) | 0.5 | 1.5 |
| wt % FeCl3 | 1 | 5 |
| # of Passes | 1 | 5 |
| Exposure Time (sec) | 10 | 85 |
| Deposition Power Setting (W) | 80 | 100 |
| Pretreatment Power (W) | 80 | 120 |

Parameters such as the power (W) used to generate plasma, helium flow rate (liters per minute, LPM), and a secondary gas flow rate ($O_2$, $N_2$; LPM) can be modified.

After treating the substrate with cleaning plasma, 0.1 mL of 1, 3, and 5 wt % solution of $FeCl_3$/MeOH was drop-casted upon the surface and allowed to dry at about 40° C. for about 10 minutes.

The chemical precursor, e.g., EDOT, can be provided in a bubbler canister which can be stored within a water bath. This water bath can be used to maintain a constant temperature of the chemical precursor. There can be a line that connects from this canister to the plasma head which can be heated and/or cooled in a controlled manner. The precursor in gaseous phase can be introduced to the plasma the after-glow region and then subsequently deposited upon the substrate as a plasma polymerized conjugated coating.

Dilution flow rates for the examples were held constant at 1.0 LPM while bubbler flow rate was varied between 0.5 and 1.5 within the DOE for the deposition of EDOT. After the deposition process was completed, the surface of the sample was rinsed with MeOH to remove unreacted compounds and impurities. Film thicknesses were approximated via a step-height analysis using the Taylor Hobson profilometer and the gold profile software. Prior to the synthesis route, the samples were taped across one side length of the surface to be modified in order to maintain original conditions post deposition to compare. Roughness (Rq) was also measured by making three separate horizontal sampling lengths across the sample surface. PPy samples were analyzed under optical microscopy, interferometry, conductive atomic force microscopy, and scanning electron microscopy to elucidate varying surface features.

FT-IR spectra of selected samples were collected via attenuated total reflectance (ATR) with a germanium crystal to determine the presence of specific chemical bonds. X-ray photoelectron spectroscopy (XPS) was conducted on the PPy surfaces to determine the presence of impurities and ratio of doped heteroatom to neutral heteroatom within PPy thin films. Peak assignment values were based on literature reported values. FT-IR spectral data of samples prepared showed strong amine N—H bonds at peak 3368 and an amine N—H stretch bands (hydrogen bonded) at 3222 reciprocal centimeters ($cm^{-1}$). C—H stretching on double bonds was observed in the range from 3000-3200 $cm^{-1}$. The signal for the C—H stretch on the single bond may be similarly overlapped in signal in the 2800-3000 $cm^{-1}$ range. Amide C=O stretch (conjugated) was observed at about 1639 $cm^{-1}$. Such spectral peaks obtained of the PPy and PEDOT conjugated polymer samples using the methods disclosed are similar to if not identical to those reported in the literature, such as by using a dielectric barrier plasma reactor.

Sheet resistivity (ohm/sq) measurements were collected via a four point probe test using a four point probe. Three measurements were collected over the surface and are reported as average values. The resistivity data indicates the conjugated polymer coatings produced by the present method are conductive and have useful conductivities for a number of practical applications, including, but not limited to, electronics, and improving the anti-fogging, de-icing, anti-static properties of articles.

For XPS elemental analysis, an argon gas bombardment was used to expose a layer of the sample surface by 25 angstroms prior to the analysis so as to expose a fresh surface. Table 2 contains distribution of elements present within the sample surface. It can be seen that there is a large portion of residue chlorine and iron present from the analysis of these various wt % PPy samples. A curve fitting program was used to de-convolute the nitrogen XPS peaks and the ratio of doped N to neural N using the literature reported values was determined and was found to correlate with literature values. Binding energies of neutral N and doped N were assigned based on literature reported values The de-convoluted data analysis revealed that for the % of doped $N^+$ rises from 4.8% at 1 wt % $FeCl_3$/MeOH to 5.8% at 3 wt % $FeCl_3$/MeOH dopant layer. 7.

TABLE 2

Atomic wt % Composition Of Samples of Dopant Layer and PPy Coating

| Sample | N | C | O | Na | Fe | Cl | Si |
| --- | --- | --- | --- | --- | --- | --- | --- |
| 1 wt %, -25 angstroms | 5.1 | 52.6 | 9.3 | 8.7 | 7.7 | 13.8 | 2.7 |
| 3 wt %, -25 angstroms | 4.1 | 38.1 | 13.4 | 12.7 | 13.0 | 18.7 | — |
| 5 wt %, -25 angstroms | 1.9 | 22.0 | 35.9 | 10.6 | 19.1 | 10.5 | — |

Film morphology and resistivity measurements revealed tall plateaus and ridges (>5 um) that were observed within all imaging, making surface measurement of the samples difficult. Furthermore, the presence of speckling patterns were seen under the optical microscope and it is believed that these speckling patterns were air pockets that gave way to pressure due to elevated temperature during the plasma deposition process. The conductive atomic force microscopy (AFM) scan did not show any conductive profiles when scanned over these regions. As deposition time increased, the profile of the PPy thin film surfaces became smoother. As film thickness increases, so did sheet resistivity. As the pyrrole monomer is deposited atop the substrate, it is believed that there is an interface where PPy can be effectively doped and polymerized with the presence of $FeCl_3$. As more monomer is deposited atop existing layers of PPy, there may be decreasingly available $FeCl_3$ to dope and assist in the polymerization pyrrole monomer. Hence, as film thickness increases, resistivity measured along the surface may correspond to a local, surface resistivity of a layer of pyrrole that may not be effectively doped and polymerized and therefore may not represent the bulk resistivity of the sample.

Figure 4:
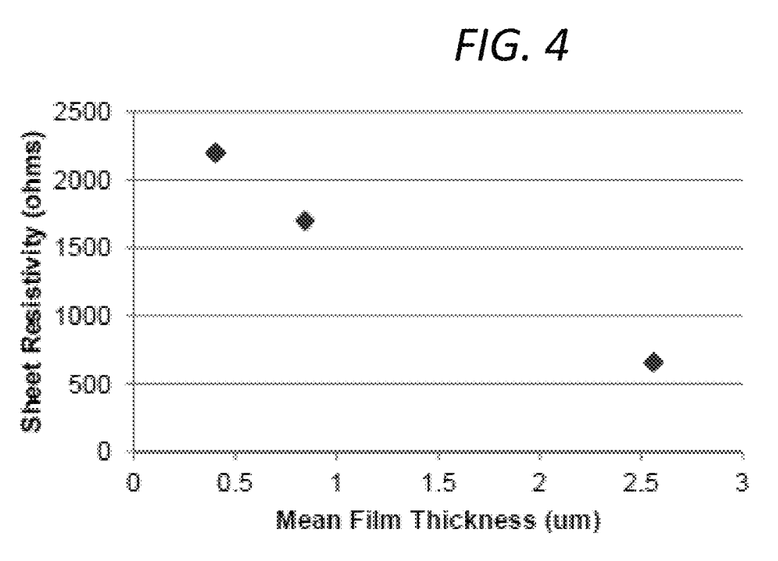
FIG. 4 shows sheet resistivity versus mean thickness of an exemplary coating according to an embodiment of the disclosure.

Plasma polymerized EDOT results were performed and indicated as Runs #15, 16, and 18 that provided samples of PEDOT, examined using the germanium ATR FT-IR analysis method. The PEDOT coatings were too thin/transparent for definitive spectral analysis. Observed signal in runs #16 and #18 were from the acrylic substrate. Run #15 had broad peaks that appeared to be mostly —OH with small peaks from acrylic. Sheet resistivity measurements, however, were conducted using the 4 point probe and provided functional parameters for the prepared samples. Run #9 exhibited outlier measurement within the center of the surface with a value of $6.0 \times 10^4$ ohms/sq (where "ohms/sq" or "ohms per square" is a well-recognized sheet resistance designation and not a bulk resistance). Table 3 summarizes transparency and conductive properties of the samples of PEDOT coatings. Each run was given a score from 1 to 16, where 1 indicated the most transparent or least resistive and 16 indicated the least transparent or most resistive. FIG. 4 depicts sheet resistivity verses mean film thickness of the PEODT samples and Table 3 provides a summary of the resistivity and transmittance, as well as combined scores for PEDOT samples prepared by the method. Run #10 demonstrates the highest scoring of a combination of sheet resistivity and transmittance, with a sheet resistivity of $2.73 \times 10^9$ ohms/sq and a transmittance of 89.87%. Run #6 demonstrated a $1.73 \times 10^{10}$ ohms/sq resistivity and a transmittance of 92.41%. Thus, the present method provides conductive conjugated PEDOT polymer coatings having good transparency.

TABLE 3

Top Ranked Least Resistive and Most Transparent Runs

| Run # | Sheet resistivity score (Ω/sq) | Transmittance score (%) | Combined Score |
|---|---|---|---|
| 10 | 5 | 4 | 9 |
| 6 | 10 | 1 | 11 |
| 9 | 3 | 9 | 12 |
| 8 | 6 | 7 | 13 |
| 11 | 2 | 12 | 14 |
| 4 | 7 | 8 | 15 |
| 7 | 1 | 14 | 15 |
| 13 | 13 | 2 | 15 |
| 2 | 12 | 5 | 17 |
| 3 | 11 | 6 | 17 |
| 5 | 16 | 3 | 19 |
| 12 | 8 | 11 | 19 |
| 15 | 4 | 16 | 20 |
| 1 | 9 | 15 | 24 |
| 14 | 14 | 10 | 24 |
| 16 | 15 | 13 | 28 |

Thus, the present method provides conductive conjugated polymer coatings having useful resistivity and conductivity parameters, as evidenced by PPy thin coatings that have been prepared with sheet resistivity as low as 6.6 kOhms/sq as well as PEDOT thin coatings that have been prepared with sheet resistivities as low as 30.3 megohms/sq and transmittance as high as 92.4%. The resultant coatings are useful for p-static dissipation suitable for anti-icing and/or defogging applications, e.g., for aerospace vehicles and other transportation equipment, satellites, etc., where such coatings would provide for conductivities in the range of $10^3$-$10^7$ ohms/sq.

We claim:

1. A conductive, charge-dissipating coating comprising:
   a solvent deposited dopant layer comprising an acceptor donor;
   a transparent conductive layer directly contacting the solvent deposited dopant layer, and
   at an interface between the solvent deposited dopant layer and the transparent conductive layer, the transparent conductive layer being doped such that the conductive, charge-dissipating coating has a sheet resistivity in the range of $10^1$-$10^7$ ohms per square;
   wherein the transparent conductive layer comprises atmospherically plasma-polymerized conductive polymer precursor material,
   wherein the solvent deposited dopant layer and the transparent conductive layer are arranged in a vertically stacked arrangement, the vertically stacked arrangement being repeated more than once, and
   wherein the conductive, charge-dissipating coating is disposed on an outer surface of an aerospace vehicle so as to provide for at least one of a de-icing property or an anti-fogging property.

2. The conductive, charge-dissipating coating claim 1, wherein the acceptor donor is one or more of an alkali metal salt, alkali metal-halogen salt, an alkali earth metal-halogen salt, a transition metal salt, a transition metal-halogen salt, a lanthanide metal salt, a lanthanide metal-halogen salt, an actinide metal salt, an actinide metal-halogen salt, or combination thereof.

3. The conductive, charge-dissipating coating of claim 1, wherein the acceptor donor is one or more of iron(III) tosylate, iron(iii) dodecylbenzenesulfonate, iron(iii) 4-morpholinepropanesulfonate, iron(iii) 4-pyridineethanesulfonate, iron(iii) 3-pyridinesulfonate iron(iii) alkylbenzenesulfonates, iron(iii) tetradecylsulfonate, iron(iii) 4-ethylbenzenesulfonate, iron(iii) camphor-sulfonate, iron (iii)R-10-camphorsulfonate, ammonium peroxydisulfate, ammonium persulfate, $HAuCl_4$, copper(II) chloride, $FeCl_3$, $FeBr_3$, FeOCl, $TiCl_4$, $ZrCl_4$, $HfCl_4$, $NbF_5$, $NbCl_5$, $TaCl_5$, $MoCl_5$, $WF_5$, $WCl_5$, $UF_6$, or $LnCl_3$.

4. The conductive, charge-dissipating coating of claim 1, wherein the atmospherically plasma polymerized conductive polymer precursor material is selected from one or more of 3,4-ethylenedioxythiophene; thiophene-3-carboxylic acid; thiophene-3-carbaldehyde; tetrabromothiophene; pyrrole-3-carboxylic acid; 4-(1H-pyrrol-1-yl)aniline; 3thiophenecarbonyl chloride; 3-thienylmethanol; 3-methylthiophene; 3-chlorothiophene; 3-butylthiophene; 3-bromothiophene; 3-bromo-4-methylthiophene; 3-bromo-2-chlorothiophene; 3-acetylthiophene; 3,4-dibromothiophene; 3-(1H-pyrrol-1-yl)aniline; 2-iodothiophene; 2-chlorothiophene; 2-chloro-3-methylthiophene; 2-bromothiophene; 2-bromo-5-chlorothiophene; 2-bromo-3-methylthiophene; 2,5-diidothiophene; 2,5-dibromothiophene; 2,4-dibromothiophene; 2,3-dibromothiophene; 2-(3-thienyl)ethanol; or 1-(2-aminophenyl)-pyrrole.

5. The conductive, charge-dissipating coating of claim 1, wherein the transparent conductive layer comprises a conductive polymer of one or more atmospherically plasma polymerized precursor materials selected from one or more of an aromatic heterocycle or substituted benzene; rubicene; pyrene; phenanthrene; perylene; pentacene; triphenylene and substituted derivaties; coronene; chrysene; benzopyrene; benzoperylene; benzanthracene; anthracene and derivatives thereof; pyrrole and substituted derivatives; thiophene and substituted derivatives, selenophene and substituted derivatives; aniline and substituted derivatives; furan and substituted derivatives; N-methylpyrrole and substituted derivatives; or isothionaphtene and substituted derivatives.

6. The conductive, charge-dissipating coating of claim 1, wherein the transparent conductive layer further comprises atmospherically plasma polymerized polymer of one or more precursor materials selected from one or more of tetrafluoroethylene; glycidyl methacrylate; dimethylaminomethylstyrene; perfluoroalkyl ethyl methacrylate; trivinyltrimethoxycycletrisiloxane; furfuryl methacrylate; cyclohexyl methacryate-co-ethylene glycol dimethacrylate; pentafluorophenyl methacrylate-co-ethylene glycol diacrylate; 2-hydroxyethyl methacrylate-co-ethylene glycol diacrylate; or methacrylic acid-co-ethylene glycol dimethacrylate.

7. The conductive, charge-dissipating coating of claim 1, wherein the conductive coating sheet resistance is in the range of 5-1000 ohms/sq.

8. The conductive, charge-dissipating coating of claim 1, wherein the conductive coating sheet resistance is in the range of 1000-10,000,000 ohms/sq.

9. An article comprising at least a portion of an aerospace vehicle, the portion of the aerospace vehicle being coated with a conductive, charge-dissipating coating, the conductive, charge dissipating coating comprising:
a solvent deposited dopant layer comprising an acceptor donor;
a transparent conductive layer directly contacting the solvent deposited dopant layer, and
at an interface between the solvent deposited dopant layer and the transparent conductive layer, the transparent conductive layer being doped such that the conductive, charge-dissipating coating has a sheet resistivity in the range of $10^1$-$10^7$ ohms per square;
wherein the transparent conductive layer comprises atmospherically plasma-polymerized conductive polymer precursor material,
wherein the conductive, charge-dissipating coating is disposed on an outer surface of the aerospace vehicle so as to provide for at least one of a de-icing property or an anti-fogging property, and wherein the solvent deposited dopant layer and the transparent conductive layer are arranged in a vertically stacked arrangement, the vertically stacked arrangement being repeated more than once.

10. A method of making the conductive, charge-dissipating coating of claim 5, the method comprising the steps of:
(i) contacting an article with a solution of dopant in a volatile solvent, removing the volatile solvent and forming a dopant layer on the article surface, the dopant layer comprising an acceptor donor;
(ii) introducing one or more conjugated polymer precursors to an atmospheric plasma;
(iii) depositing a transparent conductive layer comprising a conjugated polymer on at least a portion of the dopant layer and at least a portion of the article surface, the transparent conductive layer directly contacting the dopant layer, an interface being disposed between the dopant layer and the transparent conductive layer, the transparent conductive layer being doped such that the conductive, charge-dissipating coating has a sheet resistivity in the range of $10^1$-$10^7$ ohms per square; and
(iv) the dopant layer and the transparent conductive layer forming a conductive, charge dissipating coating on the article surface,
wherein the transparent conductive layer comprises atmospherically plasma-polymerized conductive polymer precursor material, and
wherein the conductive, charge dissipating coating is disposed on an outer surface of an aerospace vehicle so as to provide for at least one of a de-icing property or an anti-fogging property; and wherein the dopant layer and the transparent conductive layer are arranged in a vertically stacked arrangement, the vertically stacked arrangement being repeated more than once.

11. The method of claim 10, wherein the steps (i), (ii), and (iii) are carried out in the sequence (i), (ii), and (iii).

12. The method of claim 10, wherein each of steps (i), (ii), and (iii) are repeated in the sequence (i), (ii), and (iii) at least once.

13. The method of claim 10, wherein the volatile solvent comprises a $C_{1-8}$ alcohol, water, or mixture thereof.

14. The method of claim 10, wherein the acceptor donor is a metal salt or a metal-halogen salt.

15. The method of claim 10, wherein the acceptor donor is a transition metal salt, transition metal-halogen salt, a lanthanide metal salt, a lanthanide metal-halogen salt, an actinide metal salt, an actinide metal-halogen salt, or combination thereof.

16. The method of claim 10, wherein the acceptor donor is one or more of iron(III) tosylate, iron(iii) dodecylbenzenesulfonate, iron(iii) 4-morpholinepropanesulfonate, iron (iii) 4-pyridineethanesulfonate, iron(iii) 3-pyridinesulfonate iron(iii) alkylbenzenesulfonates, iron(iii) tetradecylsulfonate, iron(iii) 4-ethylbenzenesulfonate, iron(iii) camphorsulfonate, iron(iii) R-10-camphorsulfonate, ammonium peroxydisulfate, ammonium persulfate, $HAuCl_4$, copper(II) chloride, $FeCl_3$, $FeBr_3$, $FeOCl$, $TiCl_4$, $ZrCl_4$, $HfCl_4$, $NbF_5$, $NbCl_5$, $TaCl_5$, $MoCl_5$, $WF_5$, $WCl_5$, $UF_6$, or $LnCl_3$.

17. The method of claim 10, wherein the one or more conjugated polymer precursors is one or more of an aromatic heterocycle or substituted benzenes rubicene, pyrene; phenanthrene; perylene; pentacene; triphenylene and substituted derivatives; coronene; chrysene; benzopyrene; benzoperylene; benzanthracene; anthracene; and derivatives thereof; pyrrole and substituted derivatives; thiophene and substituted derivatives, selenophene and substituted derivatives; aniline and substituted derivatives; furan and substituted derivatives; N-methylpyrrole and substituted derivatives; or isothionaphtene and substituted derivatives.

18. The method of claim 10, wherein the one or more conjugated polymer precursors is one or more of 3, 4-ethylenedioxythiophene; thiophene-3-carboxylic acid; thiophene-3-carbaldehyde; tetrabromothiophene; pyrrole-3-carboxylic acid; 4-(1H-pyrrol-1-yl )aniline; 3-thiophenecarbonyl chloride; 3-thienylmethanol; 3-methylthiophene; 3-chlorothiophene; 3-butylthiophene; 3-bromothiophene; 3-bromo-4-methylthiophene; 3-bromo-2-chlorothiophene; 3-acetylthiophene; 3,4-dibromothiophene; 3-(1H-pyrrol-1-yl)aniline; 2-iodothiophene; 2-chlorothiophene; 2-chloro-3-methylthiophene; 2-bromothiophene; 2-bromo-5-chlorothiophene; 2-bromo-3-methylthiophene; 2,5-diidothiophene; 2,5-dibromothiophene; 2,4-dibromothiophene; 2,3-dibromothiophene; or 2-(3-thienyl)ethanol; 1-(2-aminophenyl)-pyrrole.

19. The method of claim 10, further comprising, prior to step (i): rinsing the substrate with a $C_{1-8}$ alcohol; plasma cleaning the article surface; or rinsing the substrate with a $C_{1-8}$ alcohol and subsequently plasma cleaning the article surface.

20. The method of claim 10, wherein the conductive, charge dissipating coating sheet resistance is in the range of 5-1000 ohms/sq.

21. The method of claim 10, wherein the conductive, charge dissipating coating sheet resistance is in the range of 1000-10,000,000 ohms/sq.

22. The method of claim 10, further comprising in step (ii) the introduction to the plasma of one or more additional precursors selected from tetrafluoroethylene; glycidyl methacrylate; dimethylaminomethylstyrene; perfluoroalkyl ethyl methacrylate; trivinyltrimethoxycycletrisiloxane; furfuryl methacrylate; cyclohexyl methacryate-co-ethylene glycol dimethacrylate; pentafluorophenyl methacrylate-co-ethylene glycol diacrylate; 2-hydroxyethyl methacrylate-co-ethylene glycol diacrylate; and methacrylic acid-co-ethylene glycol dimethacrylate.

* * * * *